United States Patent [19]

Kamiya

[11] Patent Number: 5,392,120
[45] Date of Patent: Feb. 21, 1995

[54] DUAL INTERFEROMETER MEASURING SYSTEM INCLUDING A WAVELENGTH CORRECTION RESULTING FROM A VARIATION IN THE REFRACTIVE INDEX

[75] Inventor: Saburo Kamiya, Yokohama, Japan

[73] Assignee: Nikon Corporation, Tokyo, Japan

[21] Appl. No.: 90,579

[22] Filed: Jul. 12, 1993

[30] Foreign Application Priority Data

Jul. 14, 1992 [JP] Japan .................................. 4-210799

[51] Int. Cl.⁶ ............................................... G01B 9/02
[52] U.S. Cl. ...................................... 356/358; 356/349
[58] Field of Search ............... 356/358, 349, 345, 361, 356/351

[56] References Cited

U.S. PATENT DOCUMENTS

| | | | |
|---|---|---|---|
| 4,215,938 | 8/1980 | Farrand et al. | 356/358 |
| 4,814,625 | 3/1989 | Yabu | 250/548 |
| 4,984,898 | 1/1991 | Hofler et al. | 356/358 |
| 5,141,318 | 8/1992 | Miyazaki et al. | 356/358 |
| 5,146,284 | 9/1992 | Tabarelli et al. | 356/345 |

Primary Examiner—Samuel A. Turner
Assistant Examiner—Robert Kim
Attorney, Agent, or Firm—Shapiro and Shapiro

[57] ABSTRACT

A laser interferometer apparatus is designed such that the path of the laser beam of an interference refractometer to the path of the laser beam of a measuring interferometer is covered with a blast duct temperature-controlled atmospheric gas blown by a blower fan is directed through the interior of the blast duct toward the corner cube of a moving stage along the laser beam.

4 Claims, 4 Drawing Sheets

DUAL INTERFEROMETER MEASURING SYSTEM INCLUDING A WAVELENGTH CORRECTION RESULTING FROM A VARIATION IN THE REFRACTIVE INDEX

BACKGROUND OF THE INVENTION

1. Field of the Invention

This invention relates to an interferometer apparatus for measuring the position, the momentum, the shape or the like of an object by the use of a coherent light beam, and particularly is suitable for a laser interferometer apparatus widely used for highly accurate position measurement.

2. Related Background Art

For example, in an exposing apparatus for the manufacture of semiconductors, a laser interferometer apparatus is used as a measuring apparatus for measuring the coordinates of a wafer stage or mask stage for highly accurately positioning a wafer. The laser interferometer apparatus is an apparatus for applying a laser beam to two members displaced relative to each other, making a signal obtained by photoelectrically converting the interference beam of the reflected two laser beams, for example, into a pulse signal and increment or decrement counting this pulse signal to thereby measure the relative displacement of the two members. There is known an apparatus in which temperature-controlled air is blown to stabilize the fluctuation of the air in the optical path of the laser beam (for example, U.S. Pat. No. 4,814,625).

In a laser interferometer apparatus of this kind, except when it is used in vacuum, the accuracy of the correction of any variation in the length of a measuring optical path (so-called wavelength correction) resulting from any variation in the refractive index of the atmospheric gas through which a laser beam passes greatly affects the final measurement accuracy. The prior-art apparatus of this kind has adopted one of two methods, i.e., a method of measuring and correcting temperature, atmospheric pressure, humidity, etc. (which are the factors of a variation in refractive index) by suitable sensors, and a method of installing a refractometer utilizing an interferometer and directly measuring and correcting the refractive index of the atmospheric gas (for example, U.S. Pat. No. 5,141,318 and U.S. Pat. No. 4,215,938).

However, the former method of estimating the refractive index from temperature, etc., for example, the method using a temperature sensor, has suffered from the inconvenience that it cannot grasp the average temperature variation of the entire measuring optical path and it is low in response speed and cannot properly measure a fast variation and thus, is insufficient in accuracy. Also, in the latter method using a refractometer, the area for measuring the refractive index differs from the area of the optical path which is the actual object of the measurement by the laser beam, and this has led to the inconvenience that accuracy is limited by the local irregularity of the refractive index.

SUMMARY OF THE INVENTION

In view of the above-noted points, the present invention has as an object thereof to provide an interferometer apparatus which, when detecting the displacement between two members displaced relative to each other by the use of a coherent light beam in a predetermined atmospheric gas, can accurately effect wavelength correction resulting from a variation in the refractive index of the gas and detect the displacement of the two members.

The present invention has as a further object thereof to provide an interferometer apparatus which effects such wavelength correction at a high speed in real time.

The interferometer apparatus according to the present invention, as shown, for example, in FIG. 1 of the accompanying drawings, has first light dividing means (1) for dividing a coherent first light beam (A1) into a measuring beam (A2) travelling in a predetermined measuring direction and a reference beam (A3), reflecting means (2) for measurement disposed for displacement in the predetermined measuring direction relative to the first light dividing means (1) for reflecting the measuring beam (A2), reflecting means (3) for reference for reflecting the reference beam (A3), and first photoelectric converting means (4) for photoelectrically converting the interference beam of the measuring beam (A2) reflected by the reflecting means (2) for measurement and the reference beam (A3) reflected by the reflecting means (3) for reference. Such a construction is the same as the prior-art construction.

Further, the present invention has second light dividing means (11) for separating a coherent second light beam (B1) into a sub-beam (B2) passing through an area through which flows the same gas as the atmospheric gas through which the measuring beam (A2) passes and a main beam (B3), a hermetically sealed container (12) disposed in an area through which the main beam (B3) passes and having a hermetically sealed space isolated from the outside, the portion thereof through which the main beam (B3) passes having a light-transmitting property, second photoelectric converting means (14) for photoelectrically converting the interference beam of the main beam (B3) after passed through the hermetically sealed container (12) and the sub-beam (B2), refractive index calculating means (32) for calculating from the output signal of the second photoelectric converting means (14) a value corresponding to a variation in the refractive index of the atmospheric gas (blowing gas) in the area through which the measuring beam (A2) passes, a blast duct (24) covering the area through which the sub-beam (B2) passes to that portion of the area through which the measuring beam (A2) passes which is near to the first light dividing means (1), blower means (21, 22) for blowing the same temperature-adjusted gas as the atmospheric gas through which the measuring beam (A2) passes, along the predetermined measuring direction through the blast duct (24) toward the reflecting means (2) for measurement, and displacement calculating means (33) for calculating the relative displacement of the reflecting means (2) for measurement and the reflecting means (3) for reference from the output signal of the first photoelectric converting means (4), the value calculated by the refractive index calculating means 32, the wind velocity of the atmospheric gas blown from the blower means (21, 22) and the rough length of the optical path of the measuring beam (A2).

According to the present invention, the first light dividing means (1), the reflecting means (2) for measurement, the reflecting means (3) for reference and the first photoelectric converting means (4) together constitute a measuring interferometer, and the second light dividing means (11), the hermetically sealed container (12) and the second photoelectric converting means (14)

together constitute a refractometer. The temperature-controlled atmospheric gas delivered from the blower means (21, 22) passes through the optical path of the sub-beam (B2) in the refractometer, and thereafter passes through the blast duct (24) and flows toward the reflecting means (2) for measurement along the measuring beam (A2) of the measuring interferometer.

In this case, when the velocity of the atmospheric gas delivered from the blower means (21, 22) is v and the distance from the optical path of the sub-beam (B2) to the optical path of measuring beam (A2) is H and the rough length of the optical path of the measuring beam (A2) (for example, the length of the optical path before wavelength correction) is L, the atmospheric gas present in the optical path of the measuring beam (A2) is atmospheric gas which passed through the optical path of the sub-beam (B2) in the refractometer at a time earlier by nearly $(H+L)/v$ to $H/v$. That is, there is a high correlation between the variation in the refractive index of the atmospheric gas passing through the refractometer and the variation in the refractive index of the atmospheric gas passing through the optical path of the measuring beam (A2) in the measuring interferometer. Accordingly, by using a value corresponding to the variation in the refractive index calculated by the refractive index calculating means (32) at the time earlier by nearly $(H+L)/v$ to $H/v$, the wavelength correction of the measuring beam (A2) can be effected highly accurately.

According to the present invention, the distribution of the refractive index of the atmospheric gas on the measuring optical path of the measuring interferometer, in other words, the average refractive index, can be estimated highly accurately and therefore, wavelength correction can be effected with very high accuracy. Thus, various interference measurements can be executed highly accurately even in the atmospheric gas. Further, the averaging time is not particularly required in order to reduce the influence of the fluctuation of the refractive index and therefore, the present invention is effective for various interferometer apparatus for positioning control of which a high speed of measurement is required.

DESCRIPTION OF THE PREFERRED EMBODIMENTS

An embodiment of an interferometer apparatus according to the present invention will hereinafter be described with reference to the drawings.

The present embodiment is one in which the present invention is applied to a laser interference length measuring machine for measuring the position of a moving stage. Also, the laser interference length measuring machine of the present embodiment is based on a well-known heterodyne interferometer using a wavelength-stabilized two-frequency linearly polarized laser source as a laser source.

Figure 1:
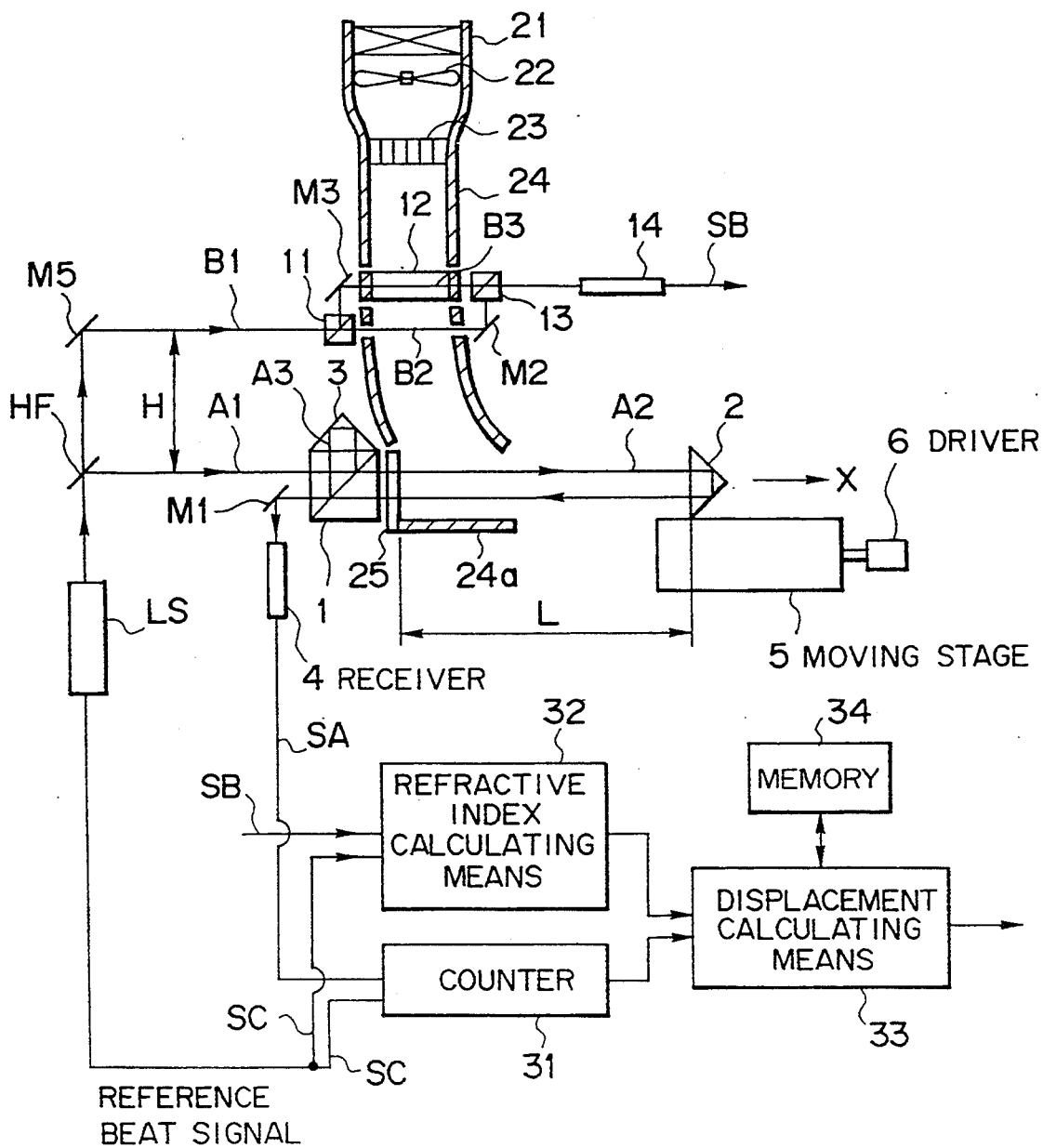
FIG. 1 is a construction diagram, partly in cross-section, showing an embodiment of an interferometer apparatus according to the present invention.

Referring to FIG. 1 which shows the construction of the laser interference length measuring machine of the present invention, a laser beam emitted from a two-frequency linearly polarized laser source LS is divided into two laser beams A1 and B1 by a beam splitter HF. The laser beam A1 enters a measuring interferometer and the laser beam B1 enters an interference refractometer via a mirror M5. The laser beams A1 and B1 each are a mixture of a laser beam of a frequency f1 polarized in a direction parallel to the plane of the drawing sheet of FIG. 1 and a laser beam of a frequency f2 ($f2=f1+\Delta f$) polarized in a direction perpendicular to the plane of the drawing sheet of FIG. 1. However, the wavelengths of the two laser beams (beam of frequency f1, f2) can be regarded as the same within the range of measurement accuracy.

The laser beam A1 first enters a polarizing beam splitter 1. A laser beam A2 which is a polarized component of the laser beam A1 which is parallel to the plane of the drawing sheet of FIG. 1 is transmitted through the polarizing beam splitter 1 and through a window 25, whereafter it travels in X direction parallel to the optical axis of the interferometer, and enters a corner cube 2 installed on a moving stage 5.

The laser beam A2 reflected by the corner cube 2 returns to the polarizing beam splitter 1. The moving stage 5 is movable in X direction by a driver 6. On the other hand, a laser beam A3 which is a polarized component of the laser beam A1 which is perpendicular to the plane of the drawing sheet of FIG. 1 is reflected by the polarizing beam splitter 1, whereafter it enters a corner cube 3 fixed to the polarizing beam splitter 1. The laser beam A3 reflected by the corner cube 3 returns to the polarizing beam splitter 1.

The laser beams A2 and A3 which have returned to the polarizing beam splitter 1 are taken out from the polarizing beam splitter 1 through the same optical path, are reflected by a mirror M1 and enter a receiver 4. The receiver 4 has incorporated therein an analyzer and a light receiving element set in a direction of 45° with respect to the directions of polarization of the laser beams A2 and A3, and interference light transmitted through the analyzer is photoelectrically converted by the light receiving element and amplified, whereby an interference beat signal SA is output. Since the frequency of the laser beam A2 and the frequency of the laser beam A3 differ by $\Delta f$ from each other, the frequency of the interference beat signal SA is $\Delta f$ in a state in which the moving stage 5 is stationary. In contrast, when the moving stage 5 is moved at a certain velocity, the frequency of the laser beam A2 Doppler-shifts and thus, the frequency of the interference beat signal SA deviates from $\Delta f$.

Within the two-frequency linearly polarized laser source LS, a laser beam having left a laser oscillator is divided by a half mirror, and the divided laser beams are photoelectrically converted through an analyzer, whereby there is produced a reference beat signal SC of the difference frequency $\Delta f$ between the frequencies f1 and f2. The interference beat signal SA output from the receiver 4 which has Doppler-shifted is supplied to one input portion of a counter 31 and the reference beat signal SC is supplied to the other input portion of the counter 31. In the counter 31, the difference between the frequencies of the reference beat signal SC and the interference beat signal SA is detected with the reference beat signal SC as the reference, and this difference is integrated. That is, the integrated value output from the counter 31 is representative of the displacement of the corner cube 2 having as the reference the position when the counter 31 is reset with the wavelength of the laser beam A2 (equal to the wavelength of the laser beam A3 within the range of measurement accuracy) as the unit. Usually, before integrated, the frequency of each signal is electrically multiplied to thereby improve the resolving power. However, this is a well-known matter and therefore need not be described herein.

The interference refractometer will now be described. This interferometric refractometer is an interferometer of the so-called Mach-Zehnder type. The laser beam B1 first enters a polarizing beam splitter 11. A laser beam B2 which is a polarized component of the laser beam B1 which is parallel to the plane of the drawing sheet of FIG. 1 is transmitted through the polarizing beam splitter 11, whereafter it travels along a path for the measurement of refractive index. This path for the measurement of refractive index is an optical path through which flows the same gas as the atmospheric gas (in the present embodiment, the gas is air) of the laser beam A2 in the measuring interferometer. The laser beam B2 is reflected by a mirror M2 and enters a polarizing beam splitter 13.

On the other hand, a laser beam B3 which is a polarized component of the laser beam B1 which is perpendicular to the plane of the drawing sheet of FIG. 1 is reflected by the polarizing beam splitter 11, whereafter it is reflected by a mirror M3 and passes through a vacuum cell 12. The vacuum cell 12 is a space of a predetermined length hermetically sealed by a light-transmitting member and kept under vacuum. The laser beam B3 which has passed through the vacuum cell 12 enters the polarizing beam splitter 13. The laser beams B2 and B3 which have entered the polarizing beam splitter 13 are taken out of the polarizing beam splitter 13 through the same optical path and enter a receiver 14. The receiver 14 has incorporated therein an analyzer and a light receiving element set in a direction of 45° with respect to the directions of polarization of the laser beams B2 and B3, and interference light transmitted through the analyzer is photoelectrically converted by the light receiving element and amplified, whereby an interference beat signal SB is output.

The frequency of the laser beam B2 and the frequency of the laser beam B3 also differ by $\Delta f$ from each other and therefore, when the refractive index of the atmospheric gas in the path of the laser beam B2 for the measurement of refractive index is constant, the frequency of the interference beat signal SB is $\Delta f$ and the phase thereof is constant. In contrast, when the refractive index of the atmospheric gas in the path for the measurement of refractive index varies, the phase of the laser beam B2 shifts (this shift is equivalent to the slight changing of the frequency) and therefore, the phase of the interference beat signal SB varies and the frequency thereof also deviates slightly from $\Delta f$. The interference beat signal SB and the reference beat signal SC produced in the two-frequency linearly polarized laser source LS are supplied to one input portion and the other input portion, respectively, of a counter 32.

In the counter 32, with the reference beat signal SC as the reference, the difference between the frequencies of the reference beat signal SC and the interference beat signal SB at a relatively long measurement interval is detected, and this difference is integrated. That is, the integrated value output from the counter 32 is representative of a variation in the refractive index of the atmospheric gas in the path of the laser beam B2 for the measurement of refractive index with the wavelength of the laser beam B2 as the unit. The integrated value output from the counter 31 and the integrated value output from the counter 32 are supplied to a calculating device 33.

A temperature-controlled blower will now be described. The reference numeral 21 designates a temperature controller. The atmospheric gas (air) adjusted to a suitable temperature by the temperature controller 21 is blown by a fan 22. The blown atmospheric gas first has its disturbance averaged by a mesh filter-like rectifier 23, whereafter it passes through the interior of a blast duct 24 and is sent to the path of the laser beam B2 for the measurement of refractive index. The atmospheric gas which has passed through the path for the measurement of refractive index further passes through the interior of the blast duct 24 and is sent to the optical path of the laser beam A2 in the measuring interferometer. Further, the atmospheric gas passes through a window 25 and the interior of a blast duct 24a (a portion of the blast duct 24) covering a range which does not hinder the movement of the moving stage 5 and is blown toward the corner cube 2 (in X direction) along the laser beam A2. Since the atmospheric gas has passed through the path for the measurement of refractive index on its way, a variation in the refractive index of the blown atmospheric gas is measured. In FIG. 1, for the convenience of representation, the vacuum cell 12 is depicted as being installed in the blast duct 24, but actually, it is of course more realistic to install the vacuum cell and other optical parts outside the blast duct 24, because this is free from the influence of vibration or the like.

Description will now be made of an example of the wavelength correcting method in the present embodiment. The displacement signal of the moving stage 5 and the refractive index signal of the atmospheric gas are supplied as integrated values from the counter 31 and the counter 32, respectively, to the calculating device 33. Only the refractive index signal is memorized in a memory 34 (which acts as a delay circuit). The calculating device 33 calculates a wavelength correction coefficient from the data of the fluctuation of the refractive index accumulated in the memory 34 and other data which will be described later, and multiplies the displacement signal of the moving stage 5 by this wavelength correction coefficient, and outputs the corrected displacement signal.

Figure 2:
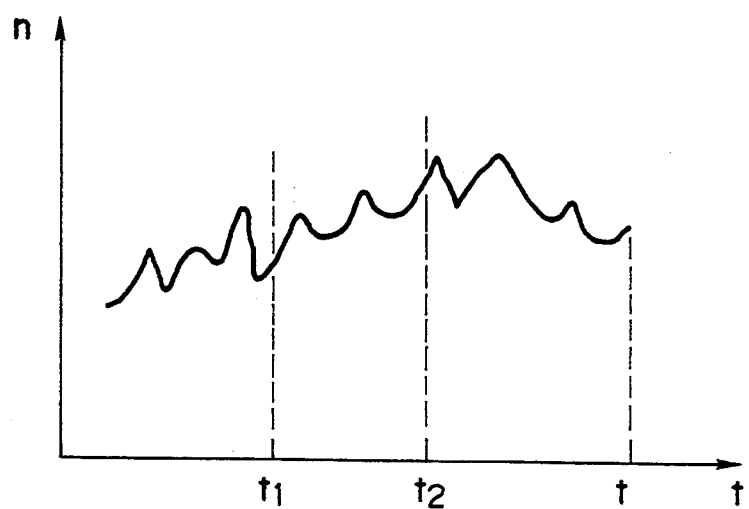
FIG. 2 is a graph for the illustration of a refractive index correcting method.

This correction calculation will now be described with reference to FIG. 2. FIG. 2 shows the time-serial data of the relative refractive index n of the atmospheric gas measured by the refractometer. Assuming that the current time is t0, it is considered that the atmospheric gas in the measuring path of the laser beam A2 of the measuring interferometer at the current time has passed the path of the laser beam B2 in the refractometer for the measurement of refractive index during a time t1 to a time t2. This is because the fluctuation of the refractive index within a short time is caused chiefly by the movement of a mass of gas differing in temperature and it passes through the path in the interferometer. Moreover, it is because gas has a good adiabatic property and therefore, a mass of the gas, when viewed with its flow, is considered to be scarcely varied in terms of time. Accordingly, the average value of the refractive indices during the time t1 to the time t2 corresponds to the average refractive index of the measuring path at the current time t0 and therefore, it is most accurate to effect correction by this average value. If the average value of the refractive indices is $n_{ave}$ and the wavelength of the laser beam A2 in vacuum is $\lambda_0$ and the integrated value of the counter 31 of the measuring interferometer is N, then the position L of the moving stage 5 (in this case, equal to the spacing between the window 25 and the corner cube 2) is represented by the following equation:

$$L = (\lambda_0/2) \times N/n_{ave} \quad (1)$$

Also, the sampling section of the refractive index for said averaging is varied by the position L of the moving stage 5, the wind velocity v of the blast, etc. The wind velocity v may be regarded as substantially constant by the setting of the blower, and can be stored in advance in the memory 34. Also, an anemometer may be installed at a suitable location to measure the wind velocity at any time and the value thereof may be used. With regard to the position of the moving stage 5, it will suffice if the value thereof before wavelength correction is known, and this can be accomplished by the use of the detection value of the measuring interferometer. From the two considerations above, the average sampling section (t2−t1) is represented by the following equation:

$$t2 - t1 = L/v \quad (2)$$

Also, the time interval between the current time t0 and the time t2 can be determined by the length of the blast duct 24 between the refractometer and the measuring interferometer. Assuming that, as shown in FIG. 1, the spacing between the path of the laser beam B2 for the measurement of refractive index and the measuring path of the laser beam A2 is H, the time interval between the time t0 and the time t2 is as follows:

$$t0 - t2 = H/v \quad (3)$$

From the foregoing, the value of the relative refractive index stored in the memory 34 can be a value from at least the time t1 until the current time, and old data can be successively renewed.

Thus, according to the present embodiment, the relative refractive index of the atmospheric gas in the path of the refractometer for the measurement of refractive index and the relative refractive index of the atmospheric gas in the measuring path of the measuring interferometer vary at a predetermined time relationship with each other and therefore, the correction of the wavelength of the laser beam passing through the measuring path of the measuring interferometer can be effected highly accurately by the use of a value corresponding to the variation in the refractive index measured by the refractometer.

In the above-described embodiment, an interferometer of the Mach-Zehnder type has been mentioned as the interferometric refractometer, but use may also be made of an interferometer of any other type. Also, the above-described embodiment is based on an interferometer of the heterodyne type, but it is apparent that even if an interferometer of the homodyne type is adopted as the base, the present invention can be equally applied. Also, of course, the corner cube 2 fixed to the moving stage 5 may be replaced by a plane mirror having its reflecting surface extending in a direction orthogonal to the length measuring direction. The present invention is not restricted to the above-described embodiment, but may adopt various constructions without departing from its basic principles.

Figure 3:
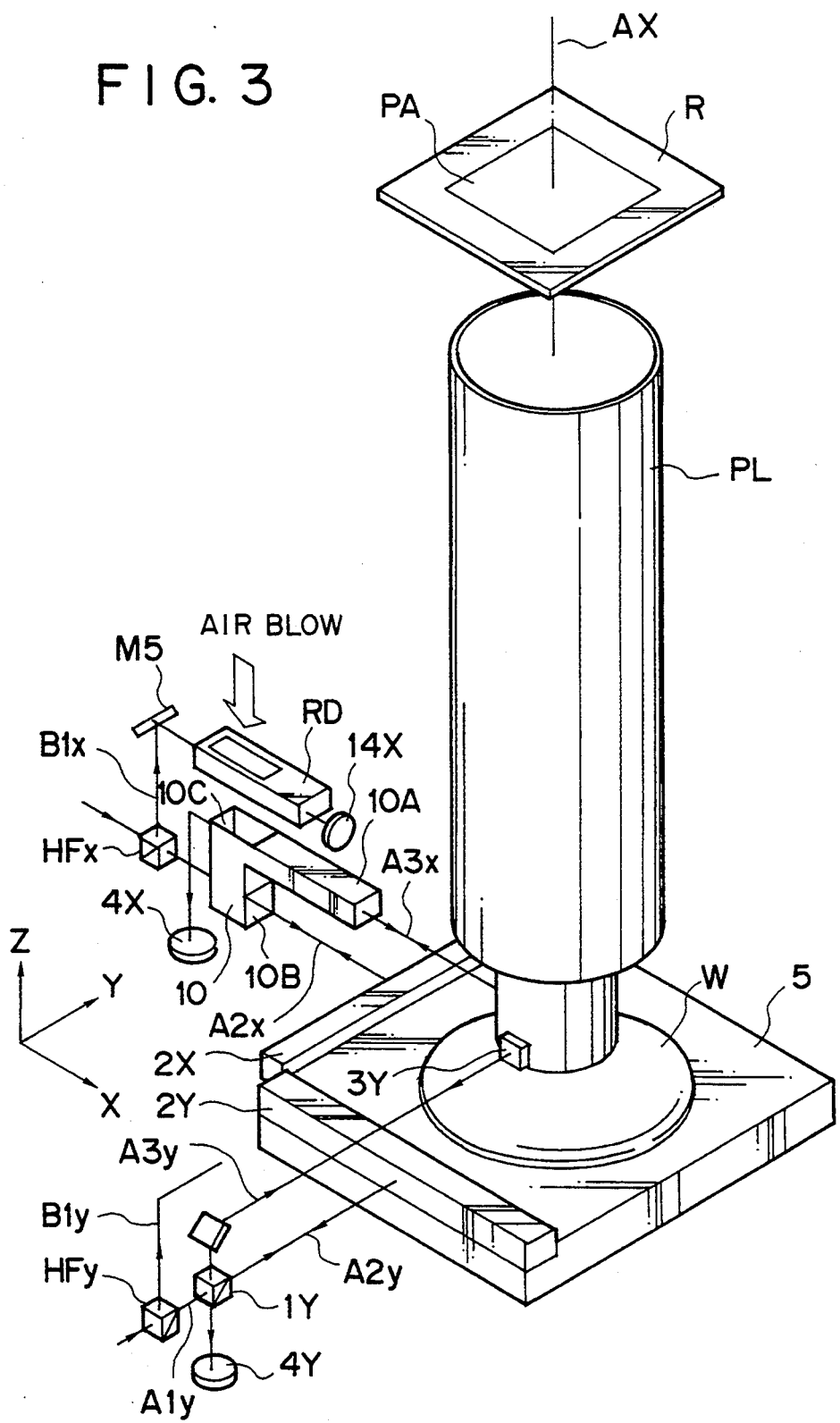
FIG. 3 is a perspective view of the interferometer apparatus of FIG. 1 as it is applied to the wafer stage of a projection type exposing apparatus.

FIG. 3 shows the interferometer apparatus of FIG. 1 as it is applied to a projection type exposing apparatus. The projection type exposing apparatus is such that a reticle (mask) R having an original image pattern area PA is held perpendicularly to the optical axis AX of a projection optical system PL and the projection image of the pattern area PA is projected and exposed onto a semiconductor wafer W as a photosensitive substrate at a predetermined magnification. The wafer W is placed on the stage 5 two-dimensionally moved in X and Y directions in a plane perpendicular to the optical axis AX. Length measuring movable mirrors 2X and 2Y are provided at two locations around the stage 5, and the movable mirror 2X has its reflecting surface extending in Y direction, while the movable mirror 2Y has its reflecting surface extending in X direction.

The reference of the measurement of the coordinates position of the stage 5 is prescribed by reference mirrors 3Y and 3X (of which the reference mirror 3X is not shown) fixed to the lower portion of the projection optical system PL in FIG. 3. An interferometer for Y direction measurement, as in FIG. 1, is comprised of a polarizing beam splitter 1Y for dividing a laser beam A1y into a length measuring beam A2y and a beam A3y for reference, and a receiver 4Y for receiving an interference beam obtained by the reflected beam of the beam A2y by the movable mirror 2Y and the reflected beam of the beam A3y by the reference mirror 3Y being combined by the polarizing beam splitter 1Y. An interferometer for X direction measurement is of the same construction as the interferometer for Y direction measurement. However, the reference characters designating the length measuring beam, the beam for reference, parts, etc. are all given a suffix x or X.

A beam from a laser source is divided into a length measuring beam A1x (A1y) and a beam B1x (B1y) for the interference refractometer by a beam splitter HFx (HFy) of the amplitude division type. The beam B1x (B1y) for the refractometer is reflected by a mirror M5 and enters a refractometer RD which may be an interferometer of the Mach-Zehnder type, and the beam transmitted therethrough is photoelectrically detected by a receiver 14X (14Y) as in FIG. 1.

Now, in the embodiment of FIG. 3, a duct (cover) 10 for blowing temperature-controlled gas is provided in a portion of the beam optical path of the position measuring interferometer of the stage 5. This duct 10, as shown in FIG. 3, rectifies and delivers the temperature-controlled gas to the space of the beam optical path which is more adjacent to the stage 5 than to the polarizing beam splitters 1X, 1Y. For this purpose, the duct 10 has a long portion 10A which may be cylindrical surrounding most of the optical paths of the reference beams A3x and A3y travelling toward the reference mirrors 3X and 3Y, respectively, and a lower opening portion 10B for delivering the gas into the optical paths of the length measuring beams A2x and A2y travelling toward the movable mirrors 2X and 2Y, respectively. The gas inflow port 10C of this duct 10 is provided in the upper portion of the duct, and the temperature-controlled gas (air blow) can be made into a vertical laminar flow and input through this port 10C.

In this case, the optical path of the interference refractometer RD can be disposed above the port 10C so as to measure any variation in the refractive index of the temperature-controlled gas immediately before flowing into the port 10C.

Figure 4:
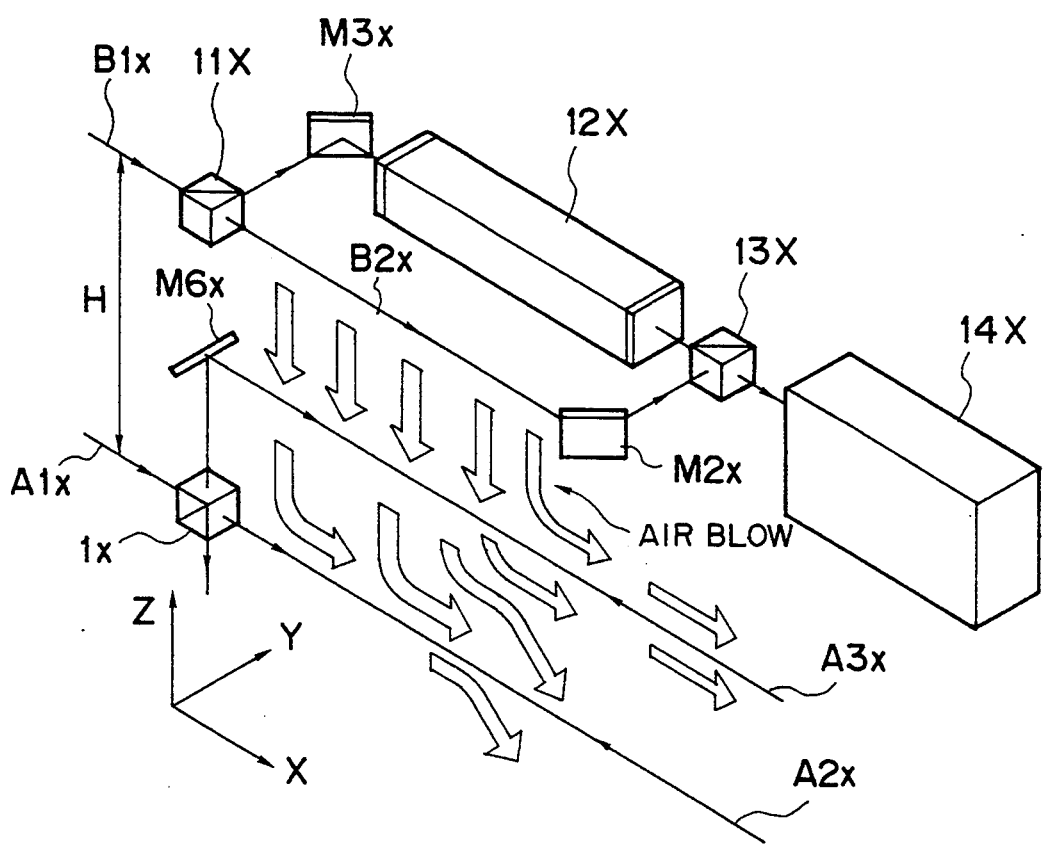
FIG. 4 is a perspective view showing the state around the measuring optical path of the interferometer apparatus shown in FIG. 3.

FIG. 4 schematically shows the optical path of the X direction interferometer apparatus in FIG. 3, and the refractometer RD, as in FIG. 1, is comprised of a polarizing beam splitter 11X, mirrors M3x, M2x, a vacuum cell 12X, a polarizing beam splitter 13X and a receiver 14X. The beam B2x for refractive index measurement is positioned upstream of the gas flowing into the port 10C of the duct 10, and is parallel to the beam A3x for reference and the length measuring beam A2x.

In the case of such construction as shown in FIGS. 3 and 4, the lag time for the correction of the measured value of the stage position can be considered in terms of the interval H between the beam B2x for refractive index measurement and the length measuring beam A2x and the flow velocity v. In the case of FIG. 4, the beam A3x for reference divided by the polarizing beam splitter 1X may be used also for refractive index measurement (beam B2x). In that case, the beam splitter 11X can be disposed so as to lie rearwardly of a mirror M6x for reflecting the beam A3x for reference in parallelism to the length measuring beam A2x, and the mirror M2x of the refractometer can be replaced by a beam splitter. If this is done, the spacing H which determines the time lag during wavelength correction will become smaller than in the case of FIG. 4 and correspondingly, the accuracy of wavelength correction will be improved.

What is claimed is:

1. An interferometer apparatus, comprising:

first light dividing means for dividing a coherent first light beam into a measuring beam travelling in a predetermined measuring direction and a reference beam;

reflecting means for measurement disposed for displacement in said predetermined measuring direction relative to said first light dividing means for reflecting said measuring beam;

reflecting means for reference for reflecting said reference beam;

first photoelectric converting means for photoelectrically converting an interference beam of said measuring beam reflected by said reflecting means for measurement and said reference beam reflected by said reflecting means for reference;

second light dividing means for dividing a coherent second light beam into a main beam and a sub-beam which passes through an area through which flows a temperature-adjusted, same atmospheric gas as atmospheric gas through which said measuring beam passes;

a hermetically sealed container disposed in an area through which said main beam passes and having a hermetically sealed space isolated from the outside, a portion thereof through which said main beam passes having a light-transmitting property;

second photoelectric converting means for photoelectrically converting an interference beam of said main beam after passed through said hermetically sealed container and said sub-beam;

refractive index calculating means for calculating from an output signal of said second photoelectric converting means a value corresponding to a variation in the refractive index of the atmospheric gas in an area through which said measuring beam passes;

a blast duct covering an area through which said sub-beam passes to a portion of the area through which said measuring beam passes which is near to said first light dividing means;

blower means for blowing the temperature-adjusted atmospheric gas through which said measuring beam passes along said predetermined measuring direction through said blast duct toward said reflecting means for measurement; and displacement calculating means for calculating the relative displacement of said reflecting means for measurement and said reflecting means for reference from an output signal of said first photoelectric converting means, the value calculated by said refractive index calculating means, the wind velocity of said atmospheric gas blown from said blower means and the rough length of the optical path of said measuring beam.

2. In an apparatus provided with a stage movable in at least one direction, a system for measuring an amount of movement or a moved position of said stage, said system comprising:

a reflecting member fixed to a portion of said stage;

a first laser interferometer for projecting a laser beam from a direction parallel to said direction of movement of said stage toward said reflecting member and receiving the laser beam reflected by said reflecting member;

a blower to deliver temperature-controlled uniform gas to a beam optical path of said first laser interferometer at a predetermined flow velocity;

a second interferometer for projecting a light beam into a flow path of said gas at a location upstream from said beam optical path of said first laser interferometer, and outputting a signal responding to variations in the refractive index of the gas at said upstream location; and a calculating device to correct a current measurement value of said first laser interferometer based on the output signal of said second interferometer from a prescribed earlier time determined in accordance with a spacing between the beam optical path of said first laser interferometer and a beam optical path of said second interferometer and the flow velocity of said gas.

3. A system according to claim 2, wherein said calculating device includes a memory circuit for storing therein the output signal from said second interferometer, for at least said predetermined time.

4. A system according to claim 2, wherein the beam optical path of said first laser interferometer and the beam optical path of said second interferometer are set substantially parallel to each other, and said blower cooperates with a duct member for directing said gas in such a manner that the beam optical path of said second interferometer lies upstream from the beam optical path of said first laser interferometer.

* * * * *